(12) United States Patent
Cheng et al.

(10) Patent No.: US 8,354,612 B2
(45) Date of Patent: Jan. 15, 2013

(54) LASER PROCESSING APPARATUS

(75) Inventors: Chi Wah Cheng, New Territories (HK); Lap Kei Chow, Kowloon (HK); Zhuanyun Zhang, New Territories (HK); Sze Leong Lai, New Territories (HK)

(73) Assignee: ASM Assembly Automation Ltd, Hong Kong (HK)

( * ) Notice: Subject to any disclaimer, the term of this patent is extended or adjusted under 35 U.S.C. 154(b) by 373 days.

(21) Appl. No.: 12/748,578

(22) Filed: Mar. 29, 2010

(65) Prior Publication Data

US 2011/0233178 A1  Sep. 29, 2011

(51) Int. Cl.
*B23K 26/00* (2006.01)
(52) U.S. Cl. .............................. 219/121.72; 219/121.67
(58) Field of Classification Search ............. 219/121.72, 219/121.67
See application file for complete search history.

(56) References Cited

U.S. PATENT DOCUMENTS

| 4,927,226 | A | * | 5/1990 | Ortiz, Jr. ....................... 398/156 |
| 5,302,798 | A | * | 4/1994 | Inagawa et al. ............ 219/121.7 |
| 2008/0290078 | A1 | | 11/2008 | Nomaru et al. |

FOREIGN PATENT DOCUMENTS

JP  2008-110383  5/2008

* cited by examiner

*Primary Examiner* — Roy Potter
(74) *Attorney, Agent, or Firm* — Ostrolenk Faber LLP

(57) ABSTRACT

A laser processing apparatus for cutting substrates comprises a laser head for generating a laser beam and first and second work holders on which substrates are mountable. A diverter positioned along a path of the laser beam is operative to selectively direct the laser beam towards a first substrate mounted on the first work holder to cut the first substrate, or towards a second substrate mounted on the second work holder to cut the second substrate, so that contemporaneous operations may be conducted on one substrate while the other substrate is being cut.

22 Claims, 4 Drawing Sheets

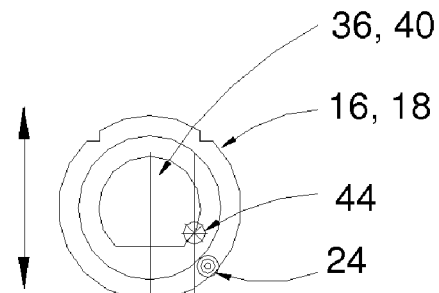
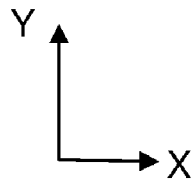

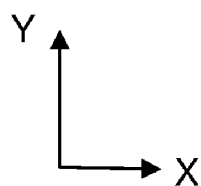
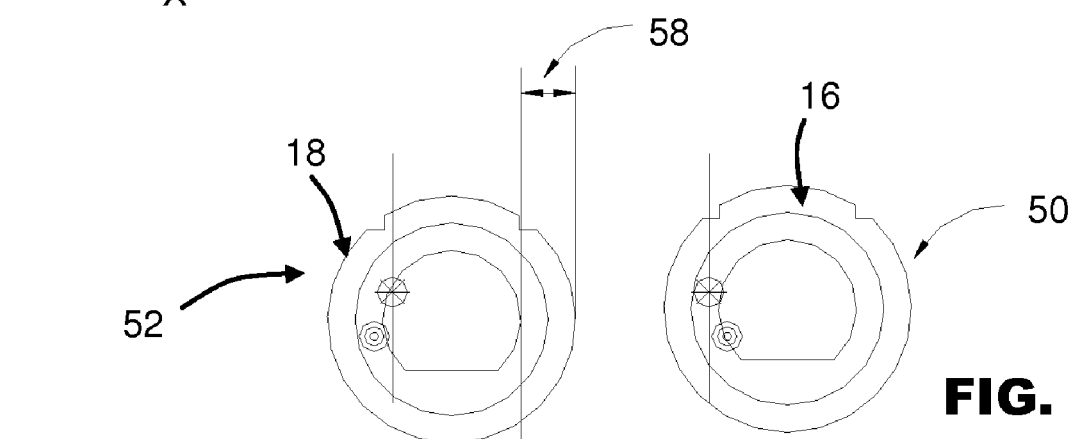
FIG. 4A
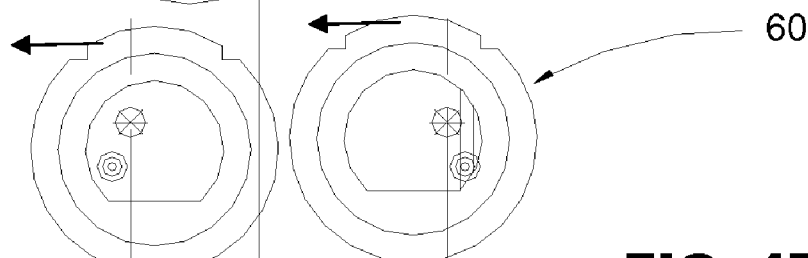
FIG. 4B
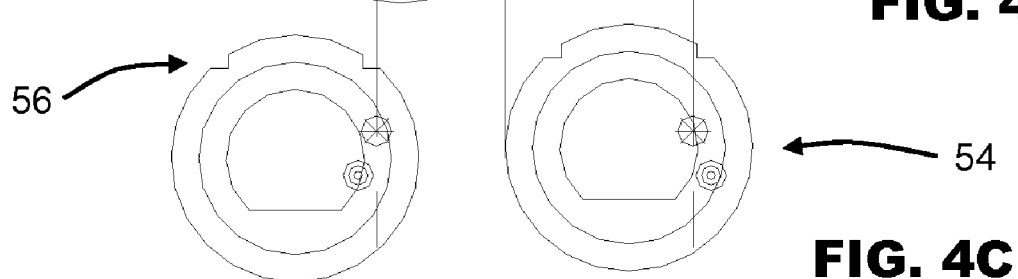
FIG. 4C

LASER PROCESSING APPARATUS

FIELD OF THE INVENTION

The invention relates to a laser processing apparatus, and in particular to a laser cutting machine for singulating or scribing grooves on electronic devices.

BACKGROUND AND PRIOR ART

Laser scribing is a process that is commonly used to cut linear grooves on the surfaces of substrates such as sapphire or silicon carbide wafers along streets formed on the substrates. Laser beams or sharply focused laser spots are generated for the process. Laser scribing may also singulate substrates by cutting entirely through the substrates when the substrates are relatively thin.

For laser scribing on substrates made of sapphire, the depths of the grooves formed are usually controlled to the order of microns, which requires precise cutting of the substrates. The focus of the laser beam also affects the depth of each cut. Therefore, it is essential to measure the height of a cutting surface of a substrate in order to regulate the depth of the cut by laser scribing. One method to measure the height of the surface of the substrate is by focusing on the surface of the substrate with an optical device. A good estimation of the height can be achieved by including more measurement points on the substrate. Generally, a laser processing apparatus incorporates a vision system which is used to capture images of the substrates for height measurement as well as for alignment before laser scribing may take place.

The estimation or measurement of the height of the surface of the substrate contributes to overhead time. Overhead time further includes the time taken for loading and unloading of substrates and for vision alignment. Typically, overhead time may be up to 60 seconds while the actual scribing time may be up to about 240 seconds to completely scribe a sapphire substrate with a diameter of 2 inches. During the overhead time, the laser head is kept idle and is therefore unproductive. If the number of vision and focusing points are increased, the overhead time will be even longer. This reduces productivity.

US Publication No. 2008/0290078 A1 entitled "Laser Processing Machine" discloses a laser processing machine that can simultaneously perform laser-cutting along two streets. This is done by splitting a laser beam into two separate laser beams using a prism. The two laser beams are of adjustable pitch so that they can operate simultaneously to cut a wafer at two separate positions. On the other hand, Japanese Publication No. 2008-110383 entitled "Laser Beam Machining Apparatus" provides a laser beam machining apparatus which can machine workpieces held on two chuck tables simultaneously by using a beam splitter to split a laser beam into two beams. The laser beam disperses along two separate routes for machining two workpieces held on the two chuck tables simultaneously.

While efficiency of machining is increased since two scribing laser beams are produced at the same time in the above prior art to scribe wafers at two separate positions, it is a challenge to manage two laser beams which have to be located at very close proximity to each other after splitting the source laser beam. It is technically difficult to control the quality and energy variation of two beams from a single source. This may tend to result in different scribing depths formed along different scribing lines. Moreover, the power of the laser head must be doubled to maintain the same laser energy level at the two positions, which increases the cost of the machine. Furthermore, during the overhead time, the laser head is still left idle and productivity is lost. As laser heads are expensive, it would be preferable to maximize usage of the same and to promote the efficient use of the laser heads.

SUMMARY OF THE INVENTION

It is thus an object of the present invention to seek to provide a laser processing apparatus which increases laser scribing output while achieving greater control of a laser scribing depth.

According to a first aspect of the invention, there is provided a laser processing apparatus for cutting substrates, comprising: a laser head for generating a laser beam; first and second work holders on which substrates are mountable; and a diverter positioned along a path of the laser beam, the diverter and the laser head being movable relative to each other between a first position wherein the diverter is operative to divert the laser beam to cut a first substrate mounted on the first work holder, and a second position wherein the diverter is operative to divert the laser beam to cut a second substrate mounted on the second work holder.

According to a second aspect of the invention, there is provided a method for cutting substrates mounted on first and second work tables, comprising the steps of: mounting a first substrate on the first work table and a second substrate on the second work table; generating a laser beam with a laser head and diverting the laser beam with a diverter onto the first substrate for cutting the first substrate; inspecting the second substrate with an optical system in preparation for cutting while the first substrate is being cut; after cutting of the first substrate has been completed, moving the diverter and the laser delivery device relative to each other from a first position to a second position so as to divert the laser beam onto the second substrate for cutting the second substrate; and thereafter removing the first substrate from the first work table.

According to a third aspect of the invention, there is provided a laser processing apparatus for cutting substrates, comprising: a laser head for generating a laser beam; first and second work holders on which substrates are mountable; and a diverter positioned along a path of the laser beam, the diverter being operative to selectively direct the laser beam towards a first substrate mounted on the first work holder to cut the first substrate, or towards a second substrate mounted on the second work holder to cut the second substrate.

According to a fourth aspect of the invention, there is provided a method for cutting substrates mounted on first and second work tables, comprising the steps of: mounting a first substrate on the first work table and a second substrate on the second work table; generating a laser beam with a laser head and diverting the laser beam with a diverter onto the first substrate for cutting the first substrate; inspecting the second substrate with an optical system in preparation for cutting while the first substrate is being cut; after cutting of the first substrate has been completed, operating the diverter to divert the laser beam onto the second substrate for cutting the second substrate; and thereafter removing the first substrate from the first work table.

It would be convenient hereinafter to describe the invention in greater detail by reference to the accompanying drawings which illustrate the preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which:

FIGS. 3A to 3E are top views of a work table of the laser scribing assembly illustrating a first working sequence for cutting a substrate on the work table to reduce a required indexing distance;

FIGS. 4A to 4C are top views of the two work tables of the laser scribing assembly illustrating an overlapping portion comprised in the ranges of movement of the work tables.

DETAILED DESCRIPTION OF THE PREFERRED EMBODIMENTS OF THE INVENTION

The preferred embodiments of the present invention will be described hereinafter with reference to the accompanying drawings.

Figure 1:
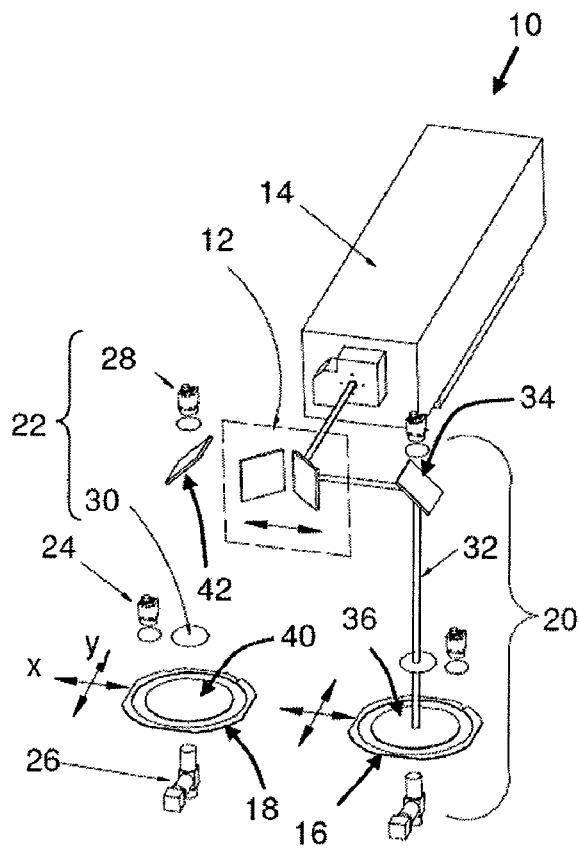
FIG. 1 is an isometric view of a laser scribing assembly incorporating two work tables according to the preferred embodiment of the present invention, wherein a laser beam is shown scribing a wafer on one work table.
Figure 1A:
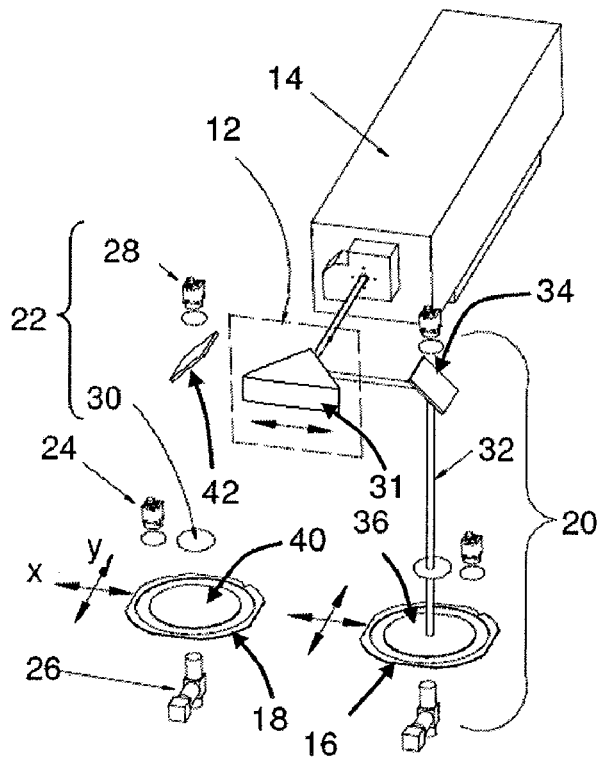
FIG. 1A is an isometric view of the laser scribing assembly 10 of FIG. 1 illustrating a laser beam diverter 12 in the form of a prism 31.

FIG. 1 is an isometric view of a laser scribing assembly 10 incorporating two work tables according to the preferred embodiment of the present invention, wherein a laser beam is shown cutting or scribing a substrate 36, 40, such as a wafer, on one work table. FIG. 1A is an isometric view of the laser scribing assembly 10 of FIG. 1 illustrating a laser beam diverter 12 in the form of a prism 31. The laser scribing assembly 10 comprises a laser source in the form of a laser head 14 for generating a laser beam, the first and second work tables which may be chuck tables 16, 18 movable in X-Y-8 directions, a laser beam delivery system 20 and an optical system. The optical system comprises a set of co-axial optics 22, a set of height measurement optics 24 and bottom optics 26.

The set of co-axial optics 22 comprises top optics 28 which, together with the bottom optics 26, is operative to capture images of substrates for alignment purposes. Separate sets of laser beam focusing optics 30 are located over the chuck tables 16, 18 for focusing the laser beam. The height measurement optics 24 is located adjacent to the laser beam focusing optics 30. The height measurement optics 24 measures the height of a substrate 40 to be cut so that the laser beam can be focused for scribing to the correct cutting depth.

A laser beam diverter 12 positioned along a path of the laser beam consists of two reflective laser plates which may direct the laser beam to the left and right of the laser head 14 respectively. The laser beam diverter 12 and the laser head 14 are movable relative to each other, more preferably, by driving the laser beam diverter 12 to move while the laser head 14 is stationary. The reflective plates of the beam diverter may be mirrors or surfaces of a prism 31 (see FIG. 1A) and are driven by a motor coupled to the laser beam diverter 12, such as a linear, stepping or servo motor, to move either horizontally or vertically. The reflective plates may also be driven by a rotary mechanism to rotate. Additionally, the laser beam diverter 12 may comprise any other means which directs the incoming laser beam to different directions, such as electrically-driven optical switches.

In FIG. 1, a first laser beam path 32 is formed when the laser head 14 produces a laser beam that is reflected by the laser beam diverter 12 and a first mirror 34 directly onto a first substrate 36 mounted on the first chuck table 16 when the laser beam diverter 12 is at a first position. The laser beam that is diverted onto the first substrate 36 mounted on the first chuck table 16 along the first laser beam path 32 may scribe or singulate the first substrate 36. During this scribing or singulation process, a second substrate 40 is loaded onto the second chuck table 18. Vision alignment and height measurement of the second substrate 40 can be carried out while laser scribing continues at the first chuck table 16.

Figure 2:
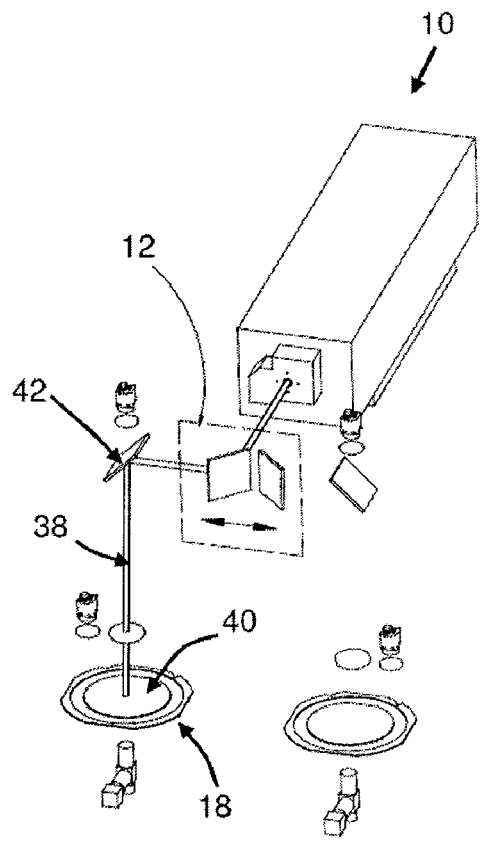
FIG. 2 is an isometric view of the laser scribing assembly wherein a laser beam is shown scribing a wafer on the other work table.

FIG. 2 is an isometric view of the laser scribing assembly 10 wherein a laser beam is shown scribing a wafer on the other work table. After scribing of the first substrate 36 has been completed, the laser beam from the laser head 14 is diverted by the laser beam diverter 12 and a second mirror 42 to a second laser beam path 38 when the laser beam diverter 12 is moved to a second position. Hence, scribing or singulating can now be performed on the second substrate 40 mounted on the second chuck table 18. At the same time, post-scribing inspection may be carried out on the first substrate 36 which remains on the first chuck table 16. Hence, there is negligible or no idling time for the laser head as the laser beam is immediately directed to begin scribing the second substrate 40 once scribing is completed on the first substrate 36. The laser scribing assembly 10 is thus efficiently utilized and kept productive throughout the processing of successive substrates. Furthermore, since the typical overhead time for height measurement, loading and unloading and vision alignment may be up to 60 seconds while a scribing time is generating up to about 240 seconds, more vision and focusing points can be obtained on one substrate while scribing is being carried out on another substrate. This improves the accuracy of vision alignment and height estimation of the substrates.

In the laser scribing assembly 10 according to the preferred embodiment of the invention, the control of laser energy is easier and the quality of laser scribing or singulating is improved as compared to the above prior art. There is no need to cater for variation between two laser beams which are split from one laser beam, as only a single laser beam is directed towards each of the substrates on the separate chuck tables 16, 18.

FIGS. 3A to 3E are top views of a work table of the laser scribing assembly 10 illustrating a first working sequence for cutting a substrate on the work table to reduce a required indexing distance. FIG. 3A shows the commencement of scribing on a street of a substrate 36, 40 mounted on a chuck table 16, 18 along the Y-direction after focusing a laser spot 44 on the desired street 46 to be cut and after the height of the substrate has been estimated by the height measurement optics 24. The chuck table 16, 18 is first indexed to the right as shown in FIG. 3B to enable scribing to continue along subsequent streets spaced out along the substrate 36, 40.

In FIG. 3C, when about half of the substrate 36, 40 has been processed, the chuck table 16, 18 rotates the substrate 36, 40 by 180 degrees. The chuck table 16, 18 continues to index to the left as shown in FIG. 3D so that a second remaining half of the substrate 36, 40 may be scribed. Therefore, although the substrate 36, 40 is only indexed through a distance 48 of about half the width of the substrate, scribing of the substrate 36, 40 can be conducted across the entire width of the substrate as shown in FIG. 3E. Since it is not necessary to index the substrate across a distance equivalent to its whole width, the width of the laser scribing assembly 10 can be reduced.

FIGS. 4A to 4C are top views of the two work tables of the laser scribing assembly 10 illustrating an overlapping portion comprised in the ranges of movement of the work tables. FIG. 4A shows the first and second chuck tables 16, 18 at their respective right-most positions 50, 52. FIG. 4C shows the first and second chuck tables 16, 18 at their respective left-most positions 54, 56. There is an overlapping distance 58 of the first and second chuck tables 16, 18. FIG. 4B shows transition positions 60 of the first and second chuck tables 16, 18 between the extreme left and right positions. The travel distance between the first and second chuck tables 16, 18 overlap so that the overall distance moved by the chuck tables 16, 18 during indexing is less than the combined widths of the chuck tables 16, 18. The width of the laser scribing assembly 10 is thus reduced. This approach helps to relieve space requirements brought about by incorporating two work tables in the laser scribing assembly 10.

Figures 5A, 5B:
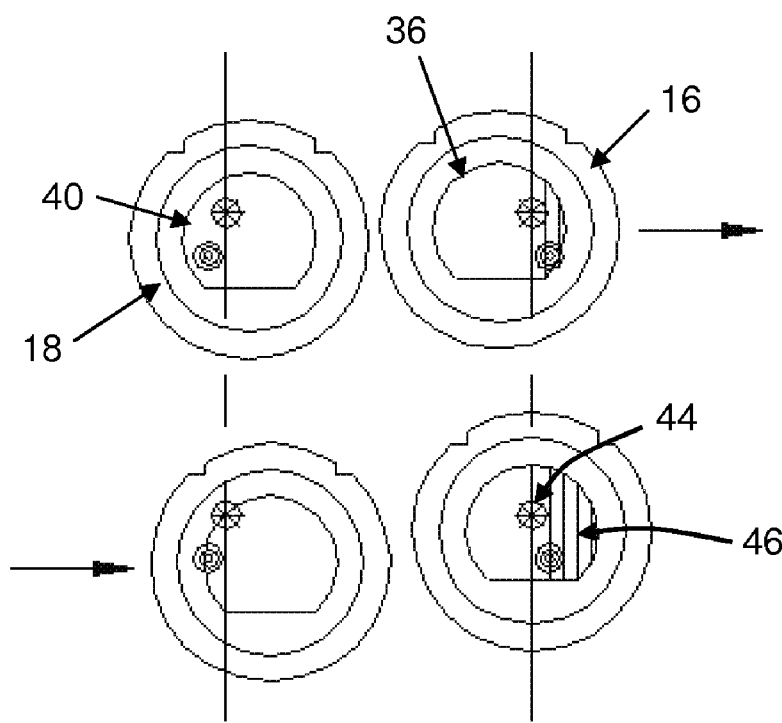
FIGS. 5A and 5B are top views of the two work tables arranged in the same configuration as in FIGS. 4A to 4C illustrating a second working sequence for processing two substrates simultaneously.

FIGS. 5A and 5B are top views of the two work tables arranged in the same configuration as in FIGS. 4A to 4C illustrating a second working sequence for processing two substrates simultaneously. In FIG. 5A, scribing has just commenced at the first chuck table 16. The second chuck table 18 cannot perform vision tasks at this point as its range of movement is constrained by the first chuck table 16. After about half of the first substrate 36 on the first chuck table 16 has been processed, the second chuck table 18 is able to move freely to perform vision tasks as shown in FIG. 5B. Hence, this approach ensures that two work tables can be accommodated in a limited workspace.

It should be appreciated that the use of more than one chuck table permits vision alignment and height estimation of one substrate mounted on one chuck table while another substrate mounted on another chuck table is being cut so that overall throughput is increased as compared to using only one chuck table. When the total overhead time is shorter than the total scribing time, the laser head can be utilized throughout the processing of successive substrates. Thus, the number of vision alignment and height measurement operations may be increased in order to obtain better cutting accuracy. Correspondingly, the increased overhead time does not contribute to non-operative time of the laser head which might decrease productivity. Post-scribing inspection may also be performed for the substrate which has been scribed while scribing continues on another substrate. Hence, idling time of the laser head may be eliminated as the laser head can be fully engaged to scribe or singulate at all times.

Further, the preferred embodiment of the present invention is advantageous over the prior art described above as the overhead time in the prior art is longer if there are two substrates which may have to be loaded and measured at a time instead of one. This longer overhead time increases the unproductive time of the laser head. Moreover, control of the energy level and quality of a single beam is easier than controlling dual beams from the same laser source, since the arrangement of laser mirrors and lenses above the tables are the same. Furthermore, by utilizing the first and second working sequences of the dual chuck tables as described above, the footprint required for the laser scribing assembly 10 is reduced, while allowing the dual chuck tables to be adopted for simultaneous operations.

The invention described herein is susceptible to variations, modifications and/or additions other than those specifically described and it is to be understood that the invention includes all such variations, modifications and/or additions which fall within the spirit and scope of the above description.

The invention claimed is:

1. Laser processing apparatus for cutting substrates, comprising:
   a laser head for generating a laser beam;
   first and second work holders on which substrates are mountable; and
   a diverter positioned along a path of the laser beam, the diverter and the laser head being movable relative to each other between a first position wherein the diverter is operative to divert the laser beam to cut a first substrate mounted on the first work holder, and a second position wherein the diverter is operative to divert the laser beam to cut a second substrate mounted on the second work holder;
   wherein the diverter comprises a plurality of reflective surfaces, each reflective surface being operative to reflect the laser beam towards a respective work holder.

2. Laser processing apparatus as claimed in claim 1, further comprising laser beam focusing optics located over the work holder for focusing the laser beam.

3. Laser processing apparatus as claimed in claim 1, further comprising height measurement optics for measuring a height of the substrate.

4. Laser processing apparatus as claimed in claim 1, further comprising top optics above each work holder and bottom optics underneath each work holder that are operative to capture images of the substrates for alignment purposes.

5. Laser processing apparatus as claimed in claim 1, wherein the diverter comprises a pair of reflective plates and/or mirrors, each plate and/or mirror being operative to reflect the laser beam towards a respective work holder.

6. Laser processing apparatus as claimed in claim 1, wherein the plurality of reflective surfaces of the diverter comprises mirrors or surfaces of a prism.

7. Laser processing apparatus as claimed in claim 1, further comprising a motor coupled to the diverter that is operative to move the diverter relative to the laser head to the first and second positions.

8. Laser processing apparatus as claimed in claim 1, further comprising a first mirror for reflecting the laser beam directly onto the first substrate, and a second mirror for reflecting the laser beam directly onto the second substrate.

9. Laser processing apparatus as claimed in claim 1, wherein the first and second work holders are arranged such that an indexing distance of each work table for cutting each substrate is limited to a range of about half a width of the substrate.

10. Laser processing apparatus as claimed in claim 1, wherein a travel distance movable by the first work holder overlaps a travel distance movable by the second work holder.

11. Method for cutting substrates mounted on first and second work tables, comprising the steps of:
    mounting a first substrate on the first work table and a second substrate on the second work table;
    generating a laser beam with a laser head and diverting the laser beam with a diverter onto the first substrate for cutting the first substrate;
    inspecting the second substrate with an optical system in preparation for cutting while the first substrate is being cut;
    after cutting of the first substrate has been completed, moving the diverter and the laser delivery device relative to each other from a first position to a second position so as to divert the laser beam onto the second substrate for cutting the second substrate; and thereafter removing the first substrate from the first work table;

wherein the diverter comprises a plurality of reflective surfaces, each reflective surface being operative to reflect the laser beam towards a respective work holder.

12. Method as claimed in claim 11, further comprising the step of mounting a third substrate onto the first work holder and inspecting the third substrate with an optical system in preparation for cutting while the second substrate is being cut.

13. Method as claimed in claim 11, wherein the step of inspecting the second substrate with an optical system further comprises the steps of capturing images of the second substrate for alignment and measuring a height of the second substrate.

14. Method as claimed in claim 11, further comprising the step of conducting post-cutting inspection of the first substrate after cutting of the first substrate has been completed and before removing the first substrate from the work table.

15. Method as claimed in claim 11, wherein the step of cutting the first substrate comprises the steps of cutting a first half of a width of the first substrate, rotating the first substrate by 180 degrees, and thereafter cutting a second half of the width of the first substrate.

16. Method as claimed in claim 11, wherein the steps of cutting the first substrate while inspecting the second substrate further comprises the steps of cutting a first half of a width of the first substrate while indexing the first work holder in a direction away from the second work holder until a range of movement of the second work holder is not constrained by the first work holder, before commencing inspection of the second substrate.

17. Method as claimed in claim 11, wherein the plurality of reflective surfaces of the diverter comprises surfaces of a prism or mirrors.

18. Method as claimed in claim 11, further comprising a motor coupled to the diverter that is operative to move the diverter relative to the laser head to the first and second positions.

19. Laser processing apparatus for cutting substrates, comprising:
 a laser head for generating a laser beam;
 first and second work holders on which substrates are mountable; and
 a diverter positioned along a path of the laser beam, the diverter being operative to selectively direct the laser beam towards a first substrate mounted on the first work holder to cut the first substrate, or towards a second substrate mounted on the second work holder to cut the second substrate.

20. Method for cutting substrates mounted on first and second work tables, comprising the steps of:
 mounting a first substrate on the first work table and a second substrate on the second work table;
 generating a laser beam with a laser head and diverting the laser beam with a diverter onto the first substrate for cutting the first substrate;
 inspecting the second substrate with an optical system in preparation for cutting while the first substrate is being cut;
 after cutting of the first substrate has been completed, operating the diverter to divert the laser beam onto the second substrate for cutting the second substrate; and thereafter removing the first substrate from the first work table.

21. Laser processing apparatus as claimed in claim 1, wherein a first one of the reflective surfaces diverts the laser beam to a first one of the work holders, and a second one of the reflective surfaces diverts the laser beam to a second one of the work holders.

22. Method for cutting substrates claimed in claim 11, further comprising the diverting of the laser beam onto the first work table is performed while not diverting the laser beam onto the second work table, and the diverting of the laser beam onto the second work table is performed while not diverting the laser beam onto the first work table.

* * * * *